United States Patent [19]

Sato

[11] 4,124,935
[45] Nov. 14, 1978

[54] METHOD FOR MANUFACTURING A BASE OF A PRESSURE MOUNT TYPE SEMICONDUCTOR DEVICE

[76] Inventor: Yoshio Sato, No. 23-15, 3-chome, Zenpukuji, Suginami-ku, Tokyo, Japan

[21] Appl. No.: 744,037

[22] Filed: Nov. 22, 1976

[30] Foreign Application Priority Data

Dec. 11, 1975 [JP] Japan .................................. 50-146918

[51] Int. Cl.² ........................ H01R 9/00; H01R 43/00
[52] U.S. Cl. .................................... 29/630 R; 29/581; 29/591; 29/592 R; 29/DIG. 47; 174/52 H; 357/81; 228/155
[58] Field of Search ................. 29/630 R, 592, 626, 29/DIG. 47, 589, 590, 591, 580, 576 C, 576 R, 581; 228/155, 170; 357/81; 174/52 H; 72/253

[56] References Cited

U.S. PATENT DOCUMENTS

| 3,197,843 | 8/1965 | Nippert | 228/155 X |
| 3,199,000 | 8/1965 | Nippert | 174/52 H |
| 3,279,039 | 10/1966 | Nippert | 29/591 |
| 3,348,297 | 10/1967 | Dijkmeijer | 228/155 |

Primary Examiner—Victor A. DiPalma

[57] ABSTRACT

A method for manufacturing a base of a pressure mount type semiconductor device which has a base body of electrically and thermally conductive metal material and a cylindrical wall integrally and vertically provided on the top of the base body and adapted to engage a pellet pressurizing member so that the pellet pressurizing member is restrained from its upward movement, the base body being integrally provided with an annular projection of weldable material which is used to projection weld to the base on the upper surface, a shell to cover a semiconductor pellet on the base and with a stud to be threaded later. In this method, a metal blank which comprises a lower metal layer of electrically and thermally conductive material having a relatively large thickness and an annular upper metal layer of copper-nickel alloy having a relatively small thickness and secured to said lower metal layer on the upper surface is prepared and then deformed by extrusion so as to form the annular projection from the upper metal layer and to form the cylindrical wall and the stud from the lower metal layer.

5 Claims, 9 Drawing Figures

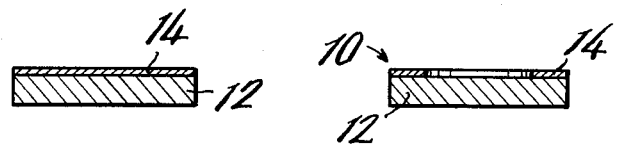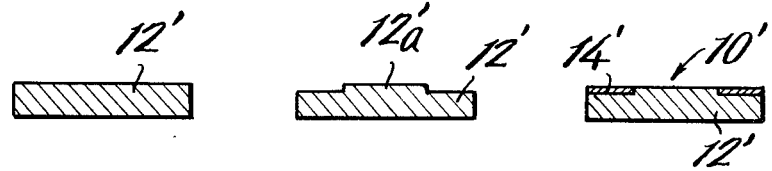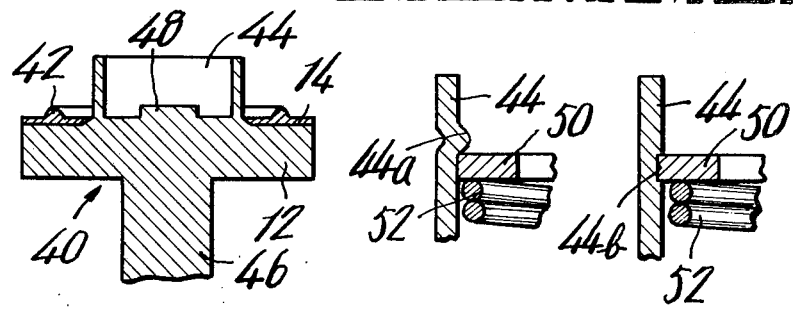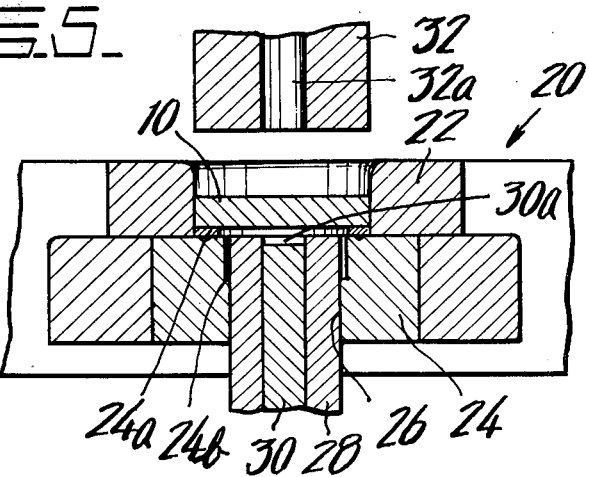

METHOD FOR MANUFACTURING A BASE OF A PRESSURE MOUNT TYPE SEMICONDUCTOR DEVICE

BACKGROUND OF THE INVENTION

In general, a pressure mount type semiconductor device such as a silicon diode or a thyristor comprises a base having a cylindrical wall provided on the top of a base body to contain a spring which exerts pressure on a semiconductor pellet. A pellet pressing member which may be in the form of a ring is engaged by a protrusion formed by diametrically and inwardly extending the cylindrical wall. The base is provided on the upper surface with an annular projection of weldable metal material which is used to projection weld a shell to cover a semiconductor pellet on the base. A conventional base of such a pressure mount type semiconductor device comprises a first base member formed by deforming a metal blank of electrically and thermally conductive metal material such as copper by extrusion and including a base body and a stud vertically extending from the lower surface of the base body, and a second or annular base member of weldable metal material such as steel having an annular projection formed on the upper surface of the annular base member by a cutter and also having a cylindrical wall extending vertically and upwardly from the inner edge of the annular base member, the second base member being silver-soldered to the first base member. As noted from the above description, the manufacture of the conventional base requires three troublesome steps, i.e. the extrusion of the first base member, cutting of the second base member and silver-soldering the first and second base members, and therefore, the effectiveness of the operation is unsatisfactory with the result that the base is expensive to manufacture.

SUMMARY OF THE INVENTION

Accordingly, it is a principal object of the present invention to provide a method for manufacturing a base of a pressure mount type semiconductor device adapted to reduce the steps involved in manufacturing the base, so that it can be inexpensively produced.

It is another object of the present invention to provide an extruder die assembly for a base of a pressure mount type semiconductor device adapted to manufacture the base in an easier manner.

In accordance with one aspect of the invention, there is provided a method for manufacturing a base of a pressure mount type semiconductor device which has a base body of electrically and thermally conductive metal material and a cylindrical wall integrally and vertically provided on the top of said base body and adapted to engage a pellet pressurizing member so that said pellet pressurizing member is restrained from upward movement, said base body being integrally provided with an annular projection of weldable material which is used to projection weld to the upper surface of the base a shell to cover the semiconductor pellet, and with a stud to be threaded later, comprising the steps of preparing a metal blank including a lower metal layer of electrically and thermally conductive metal material having a relatively large thickness and an upper and annular metal layer of copper-nickel alloy having a relatively small thickness and secured to the upper surface of said lower metal layer; and deforming said metal blank by extrusion to form said annular projection from said upper metal layer and to form said cylindrical wall and said stud from said lower metal layer.

In order to carry out the method of the invention, there is provided an extruder die assembly for a base of a pressure mount type semiconductor device which comprises a base body of electrically and thermally conductive metal material and a cylindrical integrally and vertically provided on the top of said base body and adapted to engage a pellet pressurizing member so that said pellet pressurizing member is restrained from upward movement, said base body being integrally provided with an annular projection of weldable material which is used to projection weld to the upper surface of the base a shell to cover a semiconductor pellet, and with a stud to be threaded later, comprising an upper die having a cavity to contain a metal blank which comprises a lower metal layer of electrically and thermally conductive metal material hving a relatively large thickness and an upper and annular metal layer of weldable metal material of copper-nickel alloy having a relatively small thickness and secured to the upper surface of said lower metal layer, said metal blank being reversely placed so that said lower metal layer is positioned on the upper side and said upper metal layer is positioned on the lower side; a lower die having a first cavity for forming said annular projection and a second cavity for forming said cylindrical wall; and a punch having a cavity for forming said stud and vertically movable so that said punch is struck into said cavity of said upper die during extrusion, whereby said annular projection is formed by said upper metal layer being extruded into said first cavity of said lower die and said cylindrical wall and said stud are formed by said lower metal layer being extruded into said second cavity of said lower die and said cavity of said punch, respectively.

BRIEF DESCRIPTION OF THE DRAWING

The above and other objects and features of the invention will be apparent from the description of the preferred embodiments taken with reference to the accompanying drawing in which;

FIGS. 1A and 1B are vertical sectional views of a metal blank used to manufacture a base of a pressure mount type semiconductor device in accordance with the present invention;

FIGS. 2A to 2C are vertical sectional views of another metal blank used to manufacture a base of a pressure mount type semiconductor device in accordance with the present invention;

FIG. 3 is an enlarged and vertical sectional view of a base manufactured by the method of the present invention;

FIGS. 4A and 4B show two different manners in which the cylindrical wall engages a pellet pressurizing member, respectively; and and FIG. 5 is a partial vertical sectional view of an extruder die assembly for manufacturing a base in accordance with the present invention.

DETAILED DESCRIPTION OF THE PREFERRED EMBODIMENTS

FIGS. 1 and 2 of the drawing show two metal blanks 10 and 10', respectively, each of which can be used in the method of the present invention. The metal blank 10 shown in FIG. 1 can be produced by punching a clad metal strip including a lower metal layer 12 of electrically and thermally conductive and extrudable material such as copper or zirconium-copper alloy having a relatively large thickness and an upper metal layer 14 of weldable and extrudable metal material such as a cupronickel alloy having a relatively small thickness, as shown in FIG. 1A. Then, the metal blank 10 is cut so that the center portion of the upper metal layer is removed from the lower metal layer whereby a portion of the lower metal layer 12 is exposed as shown in FIG. 1B. The metal blank 10' shown in FIG. 2 has a lower and thicker metal layer 12' and an upper and thinner metal layer 14' which are formed of materials similar to those of the lower and upper metal layers 12 and 14 of the metal blank 10', but the lower and upper metal layers 12' and 14' are silver-soldered to each other, which is different from the metal blank 10 of FIG. 1. As shown in FIG. 2B, the lower metal layer 12' can be provided with a circular protrusion 12'a which is surrounded by the upper metal layer 14' so that the top surfaces of the lower and upper metal layers 12' and 14' the top surfaces are flush with each other.

The metal blank 10 or 10' is then placed in an extruder die assembly 20 shown in FIG. 5. The die assembly 20 comprises an upper die 22 having a cavity or opening 22a to contain the metal blank 10 or 10' in an upside down position as shown in FIG. 5, and a lower die 24 having a first cavity 24a for forming an annular projection which will be described later and a second cavity 24b for forming a cylindrical wall which will be also described later. The lower die 24 is further provided with a knockout hole 26 through which a knockout 28 extends. A knockout pin 30 slidably extends through a central hole 26a in the knockout 28 to knock the product out of the die assembly 20. It should be noted that the knockout 28 and the knockout pin 30 are held in positions as shown in FIG. 5 while the metal blank 10 or 10' is extruded in the die assembly 10. In FIG. 5, reference numeral 30a designates a cavity which is formed by slightly withdrawing the knockout pin 30 downwardly as shown in FIG. 5. A punch 32 has a cavity 32a for forming a stud which will be described later. This punch is vertically movable so that the punch is struck into the cavity 22a in the upper die 22 when the metal blank 10 or 10' is extruded. The punch 32 can be securely mounted on a ram (not shown) of a press. In FIG. 5, the metal blank 10 is shown placed in the die assembly 20.

When the punch 32 is struck downwardly into the upper die 22, the metal blank 10 is deformed to produce a base product 40 as shown in FIG. 3. As the metal blank is deformed, the weldable cupronickel of the upper metal layer 14 is extruded or introduced into the first cavity 24a in the lower die 24 to form an annular projection 42 on the upper metal layer 14, and at the same time, the electrically and thermally conductive material of the lower metal layer 12 is extruded or introduced into the second cavity 24b in the lower die 24 and also into the cavity 32a in the punch 32 to form a cylindrical wall 44 for engaging a pellet pressurizing member which will be described later and a stud 46 which is to be threaded later. As shown in FIG. 3, it will be noted that the cylindrical wall 44 is formed on the base body at the middle portion of the top thereof by deforming the exposed lower metal layer 12, so that a flange is provided around the cylindrical wall. As shown in FIG. 3, it will be also noted that the annular projection 42 is provided on the upper metal layer 14. A raised portion 48 is also formed by extruding material of the lower metal layer 12 into the cavity 30a in the knockout 28 during extrusion. A semiconductor pellet may be mounted on the raised portion 48. Thereafter, the stud 46 of the base product 40 is threadedly rolled to complete a base.

As shown in FIG. 4A, a pellet pressurizing member 50 which is in the form of a flat ring is engaged by a protrusion 44a of the cylindrical wall 44 which can be formed by diametrically striking the cylindrical wall inwardly adjacent to the upper end. A coil spring 52 is compressed by the pellet pressurizing member 50 to pressirize a semiconductor pellet mounted on the raised portion 48 of the base through any suitable means. Alternatively, the pellet pressurizing member 50 can be fitted into an annular groove 44b on the inside surface of the cylindrical wall 44 as shown in FIG. 4B. A shell (not shown) is projection welded to the base at the projection 42.

While some preferred embodiments of the present invention have been described and illustrated with reference to the accompanying drawing, it will be understood that they are by way of examples, and that various changes and modifications may be made without departing from the spirit and scope of the invention, which is intended to be defined only to the appended claims.

What is claimed is:

1. A method for manufacturing a base of a pressure mount type semiconductor device which has a base body of electrically and thermally conductive material and a vertically extending cylindrical wall integral with the top of said base body at the middle portion thereof and adapted to engage a pellet pressurizing member therewithin so that said pellet pressurizing member is restrained against upward movement, said base body further having an integral annular projection of weldable material around said cylinderal wall which is used to projection weld a shell to the upper surface of said base to cover a semiconductor pellet within the cylindrical wall, and a stud on the bottom of said base body to be threaded later, said method comprising the steps of preparing a metal blank having a lower metal layer of electrically and thermally conductive and extrudable metal material having a relatively large thickness as compared to the overall thickness of the blank and an upper and annular metal layer of extrudable copper-nickel alloy having a relatively small thickness as compared to the overall thickness of the blank and secured to said lower metal layer on the upper surface thereof, said lower metal layer being exposed through said upper layer at the middle portion of said blank; placing said blank in a blank holding first cavity in an extruder die assembly which has an annular recess in the bottom surface therein with said upper annular metal layer of extrudable copper-nickel alloy against said bottom surface, said first cavity having a second cavity in the central portion of the bottom thereof with an enlarged portion around the end thereof opening into said first cavity and a knockout pin extending into said second cavity from the end of the die assembly opposite from said first cavity, and while holding the knockout pin in said second cavity, driving a punch having a stud forming bore therein into said first cavity from the open end thereof for extruding the material of said lower metal layer into said stud forming bore for forming a stud and extruding the material of said annular metal layer of copper-nickel alloys into the annular recess to form said integral annular projection and extruding the material of the lower metal layer into the enlarged portion of said second cavity around said knockout pin to form said cylindrical wall, whereby said annular projection, said cylindrical wall and said stud are simultaneously formed from said metal blank.

2. A method for manufacturing a base of a pressure mount type semiconductor device as set forth in claim 1, wherein the step of preparing the metal blank comprises preparing said blank with said lower and upper metal layers clad to each other and with the center portion of said upper metal layer removed for exposing said lower metal layer.

3. A method for manufacturing a base of a pressure mount type semiconductor device as set forth in claim 1, wherein the step of preparing the metal blank comprises silver soldering said upper metal layer of said metal blank to said lower metal layer, said upper layer being in the form of a ring.

4. A method for manufacturing a base of a pressure mount type semiconductor device as set forth in claim 3, wherein said lower metal layer has a circular protrusion thereon surrounded by said upper metal layer with the upper surfaces of said circular protrusion and said upper metal layer flush with each other.

5. A method for manufacturing a base of a pressure mount type semiconductor device as set forth in claim 1, further comprising extruding said metal blank for forming a raised portion to mount said semiconductor pellet thereon from said lower metal layer at the upper surface thereof.

* * * * *